United States Patent
Rentel

(10) Patent No.: US 11,509,145 B2
(45) Date of Patent: Nov. 22, 2022

(54) IN-SITU ON-LINE AND EMBEDDED BATTERY IMPEDANCE MEASUREMENT DEVICE USING ACTIVE BALANCING CIRCUITS

(71) Applicant: X-wave Innovations, Inc., Gaithersburg, MD (US)

(72) Inventor: Carlos Rentel, Poolesville, MD (US)

(73) Assignee: X-Wave Innovations, Inc., Gaithersburg, MD (US)

( * ) Notice: Subject to any disclaimer, the term of this patent is extended or adjusted under 35 U.S.C. 154(b) by 0 days.

(21) Appl. No.: 16/900,906

(22) Filed: Jun. 13, 2020

(65) Prior Publication Data

US 2021/0006077 A1    Jan. 7, 2021

Related U.S. Application Data

(60) Provisional application No. 62/861,384, filed on Jun. 14, 2019.

(51) Int. Cl.
  *H02J 7/00* (2006.01)
  *G01R 31/396* (2019.01)
  *G01R 31/389* (2019.01)

(52) U.S. Cl.
  CPC .......... *H02J 7/0014* (2013.01); *G01R 31/389* (2019.01); *G01R 31/396* (2019.01); *H02J 7/0047* (2013.01); *H02J 7/00712* (2020.01)

(58) Field of Classification Search
  CPC ........ H02J 7/0014; H02J 7/0047; H02J 7/007; H02J 7/0024; H02J 7/00712; G01R 31/389; G01R 31/396; G01R 31/382; B60L 58/22
  See application file for complete search history.

(56) References Cited

U.S. PATENT DOCUMENTS

| 6,577,204 B2* | 6/2003 | Midtgaard | H03B 5/366 331/116 R |
| 8,604,791 B2* | 12/2013 | Vaughan, Jr. | G01R 33/3415 324/318 |

(Continued)

FOREIGN PATENT DOCUMENTS

TW    202042436 A  *  1/2020

OTHER PUBLICATIONS

[1] Schweiger HG, Obeidi O, Komesker O, et al. Comparison of several methods for determining the internal resistance of lithium ion cells. Sensors (Basel). 2010; 10(6).

(Continued)

*Primary Examiner* — Helen Rossoshek
(74) *Attorney, Agent, or Firm* — Sheets Law PLLC; Kendal M. Sheets

(57) ABSTRACT

The present disclosure relates to methods and systems for management and control of interconnected energy storage modules, such as battery packs, that can form a larger energy storage system. The disclosure also relates to methods and system for the measurement of cell impedances in a battery pack in-situ and on-line and using active balancing circuits that may already be present in the battery pack. The methods and systems can inject disturbances of different frequencies and measure impedance by using the active balancing circuits present in the battery pack, which can transform an active balancer into a dual active balancer and impedance measurement system. The speed up of impedance measurement energy storage modules can be accomplished by using multi-tone, orthogonal or spread spectrum waveforms applied simultaneously on all or a sub-set of the active balancer circuits in an active balancer.

12 Claims, 6 Drawing Sheets

(56) References Cited

U.S. PATENT DOCUMENTS

| | | | | |
|---|---|---|---|---|
| 8,766,597 | B2* | 7/2014 | Nork | H01M 10/425 320/118 |
| 9,774,206 | B2* | 9/2017 | Kim | H02J 7/0016 |
| 10,386,422 | B2* | 8/2019 | Christensen | B60L 58/16 |
| 2014/0306662 | A1* | 10/2014 | Kim | H02J 7/007 320/118 |
| 2014/0340023 | A1* | 11/2014 | Shu | H02J 7/0016 320/107 |
| 2016/0336623 | A1* | 11/2016 | Nayar | H01M 4/44 |
| 2018/0115160 | A1* | 4/2018 | Tuladhar | H02J 3/383 |
| 2018/0166911 | A1* | 6/2018 | Ionescu | B60L 58/22 |
| 2019/0288520 | A1* | 9/2019 | Abdel-Monem | H02J 7/0029 |
| 2019/0312443 | A1* | 10/2019 | Estes | H01M 10/425 |
| 2020/0365951 | A1* | 11/2020 | Yamamoto | H01M 10/48 |
| 2021/0098998 | A1* | 4/2021 | Eo | G01R 31/3648 |
| 2021/0159706 | A1* | 5/2021 | Ginart | H02J 3/36 |
| 2021/0333328 | A1* | 10/2021 | Chung | G01R 31/3842 |

OTHER PUBLICATIONS

David A. Howey, Paul D. Mitcheson, Vladimir Yufit, Gregory J. Offer, and Nigel P. Brando, "Online Measurement of Battery Impedance Using Motor Controller Excitation," IEEE Transactions On Vehicular Technology, vol. 63, No. 6, Jul. 2014.

Wangxin Huang, and Jaber A. Abu Qahouq, "An Online Battery Impedance Measurement Method Using DC-DC Power Converter Control," IEEE Transactions on Industrial Electronics, vol. 61, No. 11, Nov. 2014.

Wang Li1, a, Genwang Liu1,b and Fuhe Yang1, "Design of Automatic Measurement System of Lithium Battery Electrochemical Impedance Spectroscopy Based on Microcomputer," Applied Mechanics and Materials vols. 241-244 (2013) pp. 259-264.

Caiping Zhang, Le Yi Wang, Xue Li, Wen Chen, George G. Yin, and Jiuchun Jiang, "Robust and Adaptive Estimation of State of Charge for Lithium-Ion Batteries," IEEE Transactions on Industrial Electronics, vol. 62, No. 8, Aug. 2015.

* cited by examiner

IN-SITU ON-LINE AND EMBEDDED BATTERY IMPEDANCE MEASUREMENT DEVICE USING ACTIVE BALANCING CIRCUITS

GOVERNMENT RIGHTS

This invention was made with government support under the terms of Contract No. 80NSSC18C0154 and awarded by the NASA Glenn Research Center, Cleveland, Ohio. The government may have certain rights to this invention.

TECHNICAL FIELD

The present disclosure relates to the technical fields of power electronics, batteries, and battery impedance measurement. More specifically, the present disclosure relates to an embedded apparatus, method, and system for measurement of impedance of batteries in-situ.

BACKGROUND

Battery packs are sometimes formed by connecting cells in parallel and/or in series. Typically, cells are connected in series to achieve higher voltages and in parallel to achieve larger capacity and/or current capability. A battery pack is said to have a xsyp configuration, where x and y are integer numbers, when x groups of y cells in parallel are connected in series. That is, first y cells are connected in parallel and x of these parallel groups are then connected in series. For instance, a 4s2p battery pack has 4 groups of 2 cells in parallel connected in series. In the previous example the integers referred to cells. Cells are the smallest energy storage units in a battery pack, but there can also be battery packs forming even larger battery packs, also called battery banks, and in that case the configuration notation is the same but the units are different. For instance, a battery bank formed by connecting five (5) battery packs in series is a 5s1p battery bank, or, say, connecting four (4) battery packs in parallel and then connecting three (3) of these in series forms a 4s3p battery bank.

Previously, a small electric impedance spectroscopy unit for in-situ measurements and adapted for a wireless sensor network was implemented in the industry. Such a design makes use of an Analog Devices AD5933 network analyzer, which is an integrated circuit (IC) targeting impedance spectroscopy, corrosion monitoring, non-destructive testing, battery cell condition monitoring and other similar applications. The AD5933 combines an on-board frequency generator ranging from 5 kHz up to 100 kHz with integrated analog to digital conversion. The response is digitized and processed via an internal DSP engine. The AD5933 operates in potentiostatic mode i.e., generates a voltage signal and measures current to obtain impedance. This platform was designed for applications such as fertilizer sensing, water quality, and touch sensing. An AD5933 was implemented for an on-line Electrochemistry Impedance Spectroscopy system that can demonstrate an error of less than 3.5% between the 0.01 Hz and 99.9 kHz frequency range on a single 18650 cylindrical Lithium battery. Other designs can inject signals in the battery using a high power half-bridge battery charger, and yet others measure impedance of the battery by using a motor inverter. Notably, a DC/DC power converter can be attached to a battery for determining the impedance of a battery. The DC/DC converter duty cycle is altered by adding a sinusoidal signal to it which generates a controllable ripple on the battery. This current ripple plus the resulting voltage ripple, caused by the current ripple, is used to measure impedance. Their results, however, were not compared to an off-line EIS unit and were limited to a single cell attached to a DC/DC converter.

On a related subject, when cells are connected in series it is desirable to have a mechanism to discharge all of them equally in a balanced manner. In those cases, a cell balancing circuitry is integrated with the battery pack. This is generally performed using two approaches: active balancing and passive balancing. Passive balancing uses resistors to dissipate extra energy, and active balancing typically moves charge from one cell to another, for instance, moving charge from a cell that has more charge to a cell that has less charge. Active balancing is more efficient but introduces more electronic components, passive balancing introduces losses (it is inefficient), but it is simpler to implement.

SUMMARY

The present embodiments relate to the use of battery active balancer electronic systems for the dual purpose of balancing a battery and measure the impedance of the constituent cells or battery modules in series. The approach can be performed silently as far the load is concerned, that is load ripple currents and/or voltages can be minimized with the embodiments presented here. Furthermore, the impedance measurement can be performed as the cells or battery modules are discharged or by charging and discharging a cell or battery module to obtain an impedance measurement at the same cell or battery module state of charge (SOC).

Furthermore, the impedance measurement can be performed while the battery is operating or not. In the latter case the impedance measurement can be performed for a fixed SOC point by shuttling charge from one cell to another with an added disturbance having a fundamental frequency equal to the frequency at which the impedance measurement is desired.

Other features and advantages of these embodiments will become apparent from the following detailed description of the presently preferred embodiments taken in conjunction with the accompanying drawings.

BRIEF DESCRIPTION OF THE DRAWINGS

The disclosed subject matter of the present application will now be described in more detail with reference to exemplary embodiments of the apparatus and method, given by way of example, and with reference to the accompanying drawings, in which.

DETAILED DESCRIPTION OF EXEMPLARY EMBODIMENTS

Figure 1:
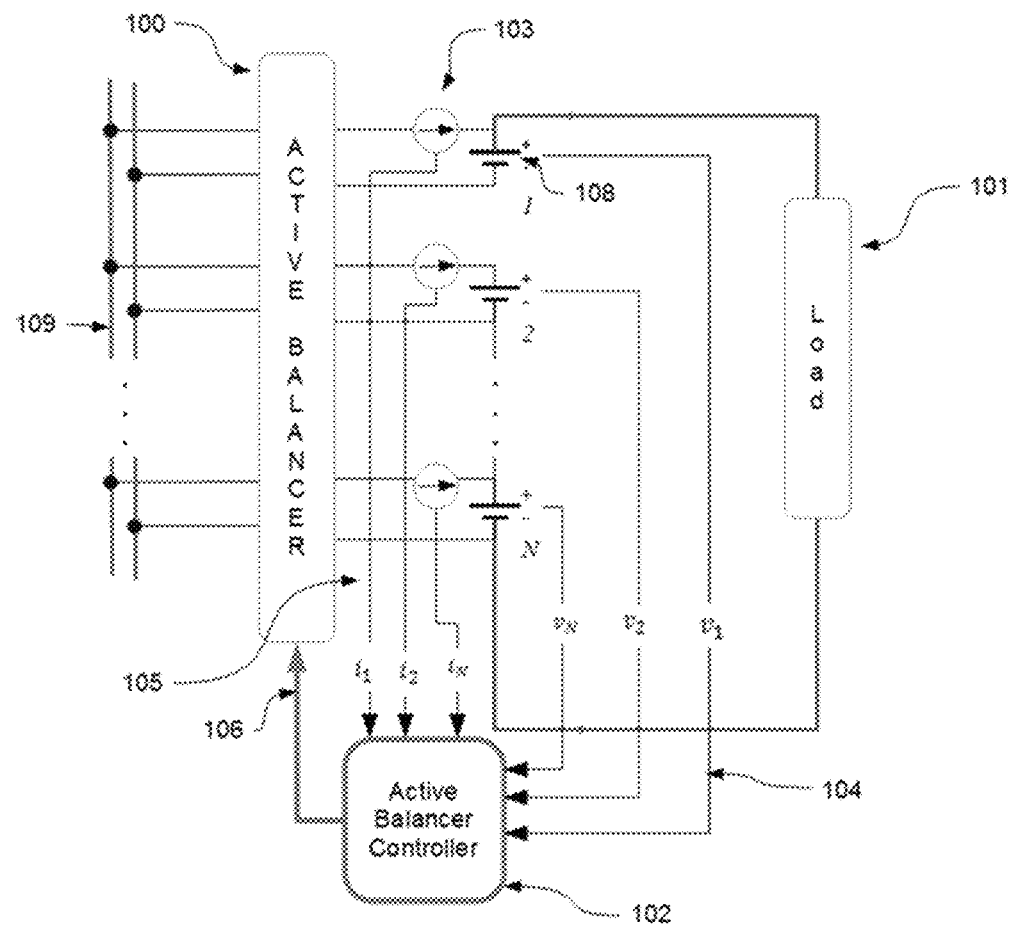
FIG. 1 is an illustration of a general active balancer for a battery pack.

A few inventive aspects of the disclosed embodiments are explained in detail below with reference to the various figures. Exemplary embodiments are described to illustrate the disclosed subject matter, not to limit its scope, which is defined by the claims. Those of ordinary skill in the art will recognize a number of equivalent variations of the various features provided in the description that follows.

It will be readily understood that the components of the present embodiments, as generally described and illustrated in the figures herein, may be arranged and designed in a wide variety of different configurations. Thus, the following more detailed description of the embodiments of the apparatus, system and/or method, as presented in the Figures, is not intended to limit the scope of the embodiments, as claimed, but merely representative of selected embodiments.

Reference throughout this specification such as "a select embodiment," "one embodiments," "some embodiments," or "an embodiment" means that a particular feature, structure, or characteristic described in connection with the embodiment is included in at least one embodiment. Thus, appearances of the phrases such as "a select embodiment," "one embodiments," "some embodiments," or "an embodiment" in various places throughout this specification are not necessarily all referring to the same embodiment.

Furthermore, the described features, structures, or characteristics may be combined in any suitable manner in one or more embodiments. One skilled in the relevant art will recognize, however, that the embodiments can be practiced without one or more of the specific details, or with other methods, components, materials, etc. In other instances, well known structures, materials, or operations are not shown or described in detail to avoid obscuring aspects of the embodiment.

Some embodiments can include battery packs or energy storage systems that can use active balancing systems. The embodiments can use existing active balancing circuits in a battery pack or energy storage system for the additional purpose of measuring the impedance of the cells or batteries attached to it in-situ and on-line. Impedance of cells in-situ and on-line can be advantageous because it can allow other algorithms that depend on impedance for their calculation to be more accurate; some of these algorithms may be State of Charge (SOC), State of Health (SOH), State of Life (SOL) or Remaining Useful Life (RUL) algorithms, and possibly others. Many of these algorithms depend on accurate cell impedance to be accurate, and since impedance changes from cell to cell and as cells age a mechanism to cost-effectively and efficiently measure impedance in-situ and on-line becomes attractive. Battery impedance measurement is typically performed off-line and in the laboratory or workshop in periodic maintenance schedules that require the system to be down. Some embodiments can leverage existing active balancing circuits to measure impedance when needed. This can enable a dual function for the active balancing circuits, and one that is in-situ and on-line. An active balancer can then balance and simultaneously measure impedance. Embodiments can have minimum to no additional hardware for measurement of cell impedance in-situ in batteries that already have an active balancer. In other words, some embodiments can make active balancer circuits more attractive with their additional impedance measurement functionality. Another advantage is that the measurement of impedance can be performed with minimum disturbance to the load when the measurement of impedance is performed, and no system downtime is necessary.

Some embodiments can use active balancing circuits to perform the additional function of cell impedance measurement in-situ while the battery is in the system and possibly operating. The active balancer circuits may already be present in which case they can be leveraged to measure impedance of the cells in a battery pack with a software update and minimum to no additional hardware, or in case the battery pack does not have an active balancer circuit the possibility to accomplish both active balancing and impedance measurement is an additional benefit that may make active balancing hardware more attractive and cost effective. Active balancing circuits are assumed to be connected to every series cell; these circuits are typically DC/DC converter types that operate by switching on/off transistors. In some embodiments, the switching waveform used in every DC/DC converter connected to every series cell can be modified to introduce an additional current or voltage disturbance that is used to measure impedance. The added disturbance can be applied at a specific frequency of interest at which the impedance is being measured. This disturbance could be a single tone or single frequency which is later change to a different tone in sequence, or multiple tones may be applied simultaneously. Impedance of the cell associated with its DC/DC converter originally used for active balancing is then measured at multiple frequencies as the ratio of the voltage disturbance to the current disturbance.

The introduction of a disturbance in current or voltage in a cell can create ripples that can leak through to the load the battery is serving. To minimize this ripple effect, the embodiments can operate multiple DC/DC converters in the active balancing circuit simultaneously and out of phase of one another to cancel the effect of the disturbance on the load. Embodiments can therefore capable of using active balancing circuits for both active balancing and as an extra benefit impedance measurement at different frequencies. This can also be performed silently in such a way that the disturbance towards the load is minimized or cancelled. If an active balancer is already present in a battery pack, it can be updated to accomplish the impedance measurement task with minimum to no additional hardware. Several studies point at the shortening of battery cycle life when ripple currents are present in a battery, therefore disturbances introduced by an impedance measurement mechanism must be done only when necessary and as small as possible. Embodiments may perform impedance measurements periodically or otherwise when needed, and they can perform these measurements when the system is idle but also perform the measurement when the battery is in operation if allowed or desired.

FIG. 1 is an illustration of a general active balancer for a battery pack. The battery is composed of N cells, such as 108, which is cell 1. The active balancer block 100 can be implemented in multiple manners, for instance using DC/DC converters which are operated in such a way as to shuttle charge from any desired cell to another. Each DC/DC converter is associated with a single series cell in the battery pack. In some embodiments, when series interconnections are described, it should be understood that those embodiments are using units of either batteries or cells.

An active balancer 100 can indicate that the embodiments can be applied to different active balancing circuit implementations that control the current out of each cell independently. The active balancer 100 under command from active balancer controller 102 can command one or more active balancer circuits inside active balancer 100 to take more or less energy out of each cell. In this way cells that have more energy can transfer that extra energy to cells with less energy via the common bus 109. The embodiments can enable all cells to discharge equally. The active balancer 100 can use a common bus 109 to shuttle charge among cells. The active balancer controller 102 decides to shuttle charge from one cell to another based on voltage 104 and/or current 105 measurements, and/or other variables such as state of charge (SOC). For instance, cell 1, shown as 108, current is measured in 103 and sent to the active balancer controller 102, and the same is performed for every cell. The active balancer controller then commands each active balancer circuit in active balancer 100 via interface 106 to shuttle charge among required cells. The active balancer 100 may include one or more processors, one or more memories, and other components for operating circuits and saving and executing software instructions. The active balancer controller may include one or more processors, one or more memories, and other components for operating circuits and saving and executing software instructions.

The embodiments can use hardware already available in an active cell balancer to measure cell impedance on-line and in-situ. The interest in on-line embedded impedance analyzers is relatively recent.

Some embodiments can rely on a controlled ripple generation by the DC/DC converters present in an active balancer. The existence of multiple power converters in an active balancer can be used to an advantage to enable simultaneous, multi-frequency measurements to expedite the impedance measurement of the cells in a battery pack and to cancel each other's disturbances towards the load so as to minimize load current and voltage ripples caused by the impedance measurement itself.

Figure 2:
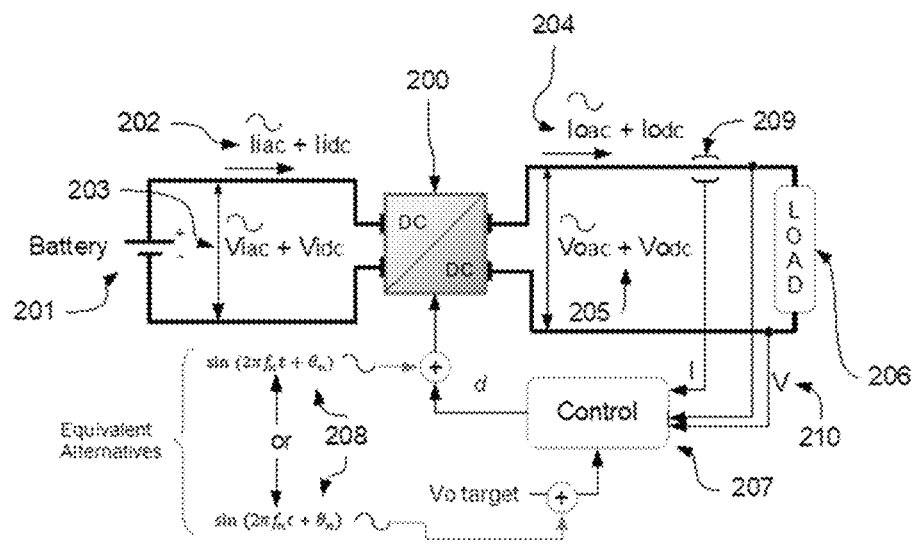
FIG. 2 is an illustration of a DC/DC converter of the embodiments that can be used in an exemplary process to measure impedance by adding a disturbance to the duty cycle of the switching waveform.

FIG. 2 is an illustration of a DC/DC converter of the embodiments that can be used in an exemplary process to measure impedance by adding a disturbance to the duty cycle of the switching waveform. In some embodiments, different DC/DC topologies and active balancing circuits can be applicable. A converter 200 can be controlled via controller 207, which may measure output current and voltage. Typically, the controller 207 sets the switches duty cycle d into the converter 200 and operates at a constant frequency to maintain a desired output voltage, current, or both. In the embodiments, an additional signal, referred to as disturbance 208, may have the form of a sinusoidal added to the duty cycle generated by the controller 207. This disturbance adds a ripple of the same form and frequency in a battery 201 voltage and current and shown as current disturbance 202 and voltage disturbance 203. The ripple or alternating voltage and current ripples added by the disturbance can be used to compute impedance at the frequency at which the disturbance alternates, which is typically slower than the switching frequency of the converter 200. The converter voltage transfer characteristics are controlled via the switching duty cycle d(t) which is adjusted in response to a feedback control loop. Since the input current is directly affected by the duty cycle an additional term which jitters this duty cycle in a small, but known, form around the mean value is introduced to generate an input current jitter. The jitter of the duty cycle may be introduced in the form of a sinusoidal added to the original duty cycle as follows:

$$\tilde{d}(t) = d + a \sin(2\pi f t + \theta) \qquad (1)$$

D can be adjusted based on the power transfer objectives of the converter, and the additional sinusoidal term is the one used to induce a controlled ripple in the cell and consequently measure the cell impedance at a single frequency point. Note that the introduction of a disturbance not only introduces a ripple in the input side current and voltage, but also into the output side as seen in 204 and 205. This output ripple is undesired and ways to minimize it or cancel it are preferred.

Figure 3:
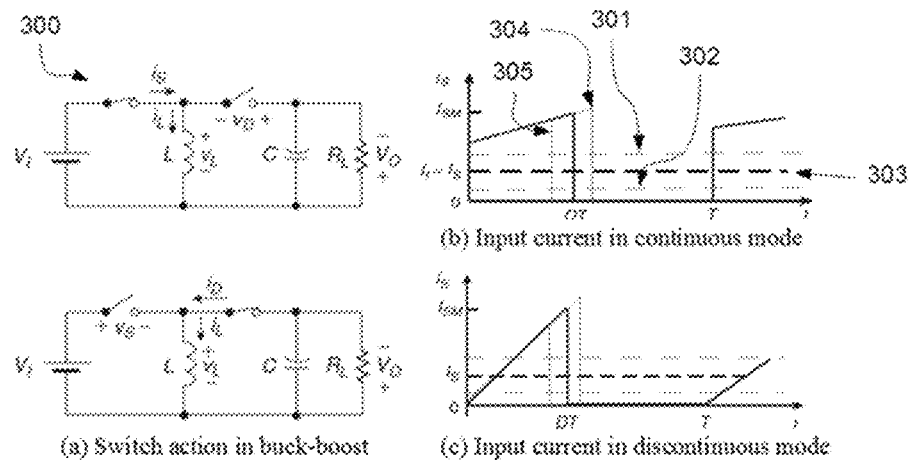
FIG. 3 is buck-boost converter of the embodiments to illustrate an exemplary process of creating current and voltage disturbances that can be used to measure cell impedance.

FIG. 3 is buck-boost converter of the embodiments to illustrate an exemplary process of creating current and voltage disturbances that can be used to measure cell impedance. FIG. 3A shows a converter 300 operating in its two modes: the one on the top when energy is pumped into the inductor, and the one in the bottom when energy in the inductor is released towards the load. FIG. 3B shows the input current, or battery current in continuous mode of operation, along with an average battery current 303, and two additional currents that are obtained by introducing duty cycle variations 304 and 305 and that can generate average currents 301 and 302, respectively. As observed, the introduction of the additional jitters or disturbance between points 304 and 305 can be used to generate a current ripple which in turn can be used to measure impedance as the ratio of voltage to current ripple. The sinusoidal jitter introduced to the duty cycle control of the DC/DC converter operates at much lower frequencies than those at which the switch itself needs to operate to transfer power. The frequencies used in a Battery Impedance Spectroscopy unit are typically between few mHz and few kHz, which are typically much lower than the tens of kHz used in DC/DC switching converters (i.e., typically >20 kHz). Note that the approach is not restricted to a sinusoidal jitter other, more complex, waveforms are possible. The embodiments can integrate this concept into existing BMS hardware architectures that use active cell balancing circuits. The use of the embodiments in an active cell balancer opens up several new possibilities, including making multiple-frequency measurements across the battery pack simultaneously to expedite the measurement process, and to cancel the ripple effect of one DC/DC converter, or active balancer circuit, on another by operating with out-of-phase disturbances that attempt to cancel each other. FIG. 3C shows the discontinuous mode of the same converter for which the principle also applies.

Figure 4:
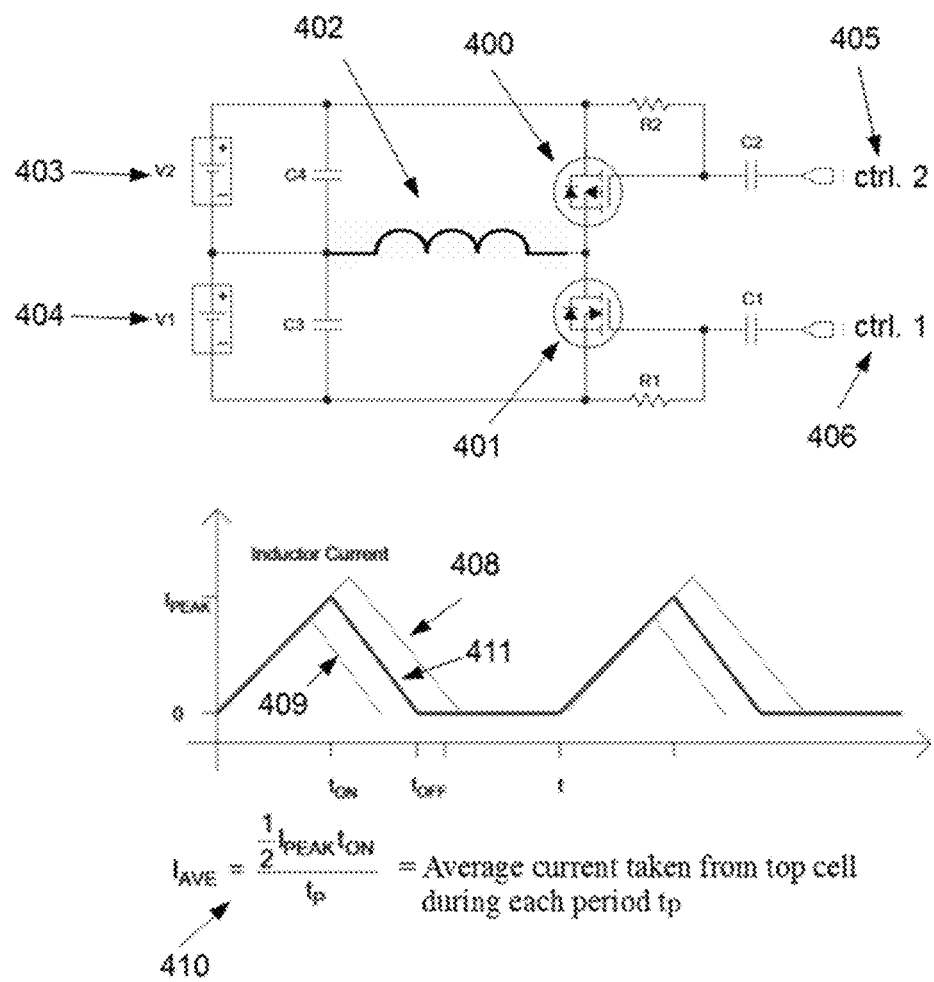
FIG. 4 is an active balancer circuit to illustrate a process of creating current and voltage disturbances that can be used to measure cell impedance.

Active balancer circuits of different forms are used to accomplish cell balancing. FIG. 4 illustrates an active balancer circuit to illustrate an exemplary process of creating current and voltage disturbances that can be used to measure cell impedance. FIG. 4 also shows a circuit that can be used to transfer charge between two adjacent cells. If energy is transferred, for instance, between top cell 403 to bottom cell 404 MOSFET 400 is first closed, this stores energy into the magnetic field of inductor 402, when MOSFET 400 is opened the current still flows through inductor 402 and through body diode of MOSFET 401 after which MOSFET 401 is closed and cell 404 is charged. MOSFETs 400 and 401 must have a dead time to avoid short circuiting cells 403 and 404. The current in the inductor is shown at the bottom of FIG. 4 when cell 403 charges cell 404, the principle is the same if cell 404 charges cell 403. The current from OA to Ipeak is the current out of the top cell and from Ipeak to OA is the current into bottom cell 404. Waveform 411 is a middle current and waveforms 408 and 409 are other waveforms where duty cycle is increased or decreased from the average 411. The equation in FIG. 4 is the average current out of the cell 403 being discharged, which indicates it is dependent on the time $t_{on}$, which can then be controlled to introduce a controlled jitter or disturbance which can be sinusoidal if needed over a longer time period and be used to measure impedance in both cells 403 and 404 simultaneously and for different frequencies. Furthermore, this exemplary approach can be used to shuttle charge with disturbance from one cell to another first during half a period of the impedance measurement frequency and then back to the original cell during the other half period (of the impedance measurement frequency) to maintain the same State of Charge (SOC) on the cells for which impedance is being measured. This can ensure the system can also perform impedance measurement for a single SOC point of the cells. If more than two cells are forming a battery pack, several of these embodiments can perform the operation simultaneously but out of phase in such a way as to minimize the disturbance or ripples of voltage and currents on the load. This is another example of measuring impedance by introducing jitter or disturbances into the duty cycle of an active balancer circuit.

Figure 5:
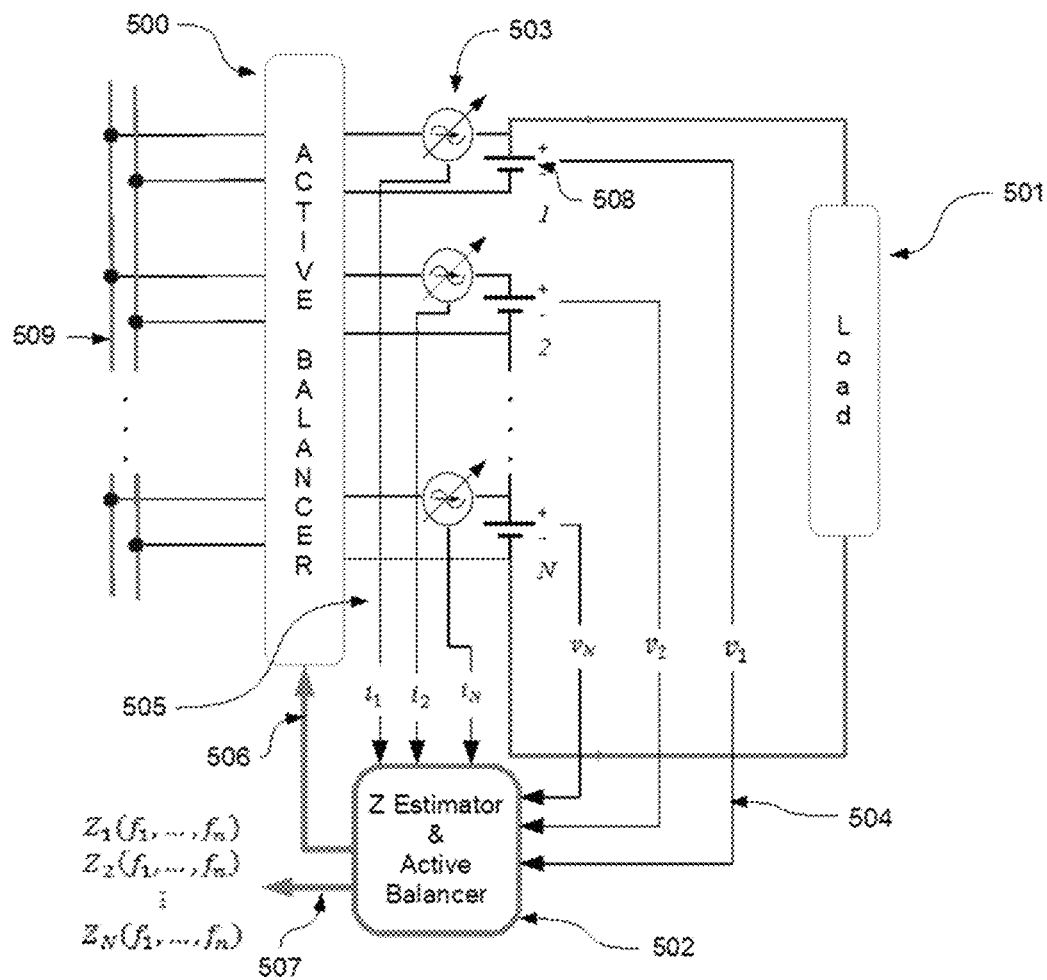
FIG. 5 is an illustration of an embodiment for an active balancer with an exemplary function of impedance measurement.

FIG. 5 is an illustration of an embodiment for an active balancer with an exemplary function of impedance measurement. One embodiment can have the same or similar hardware architecture as that shown in FIG. 1. In the embodiment, the active balancer 102 in FIG. 1, however, now becomes an impedance (i.e., Z) estimator and active balancer controller. The voltage and current measurements can be performed for the dual function of balancing as well as for impedance measurement. The current in each battery has an additional ripple caused by the injected disturbance in the DC/DC converter or the active balancer circuit, which can cause a voltage ripple. Therefore, a ratio of the voltage and current ripple can be used to obtain impedance at different frequencies. A controller 502 in the embodiment can set an active balancing strategy and the frequency, position, and type of disturbance the active balancer circuits inside the active balancer 500 must inject into their associated cells. By using disturbances that have the same frequency, but different phases, the embodiment can also minimize the ripple the load 501 sees caused by the injected disturbances used to measure impedance.

Figure 6:
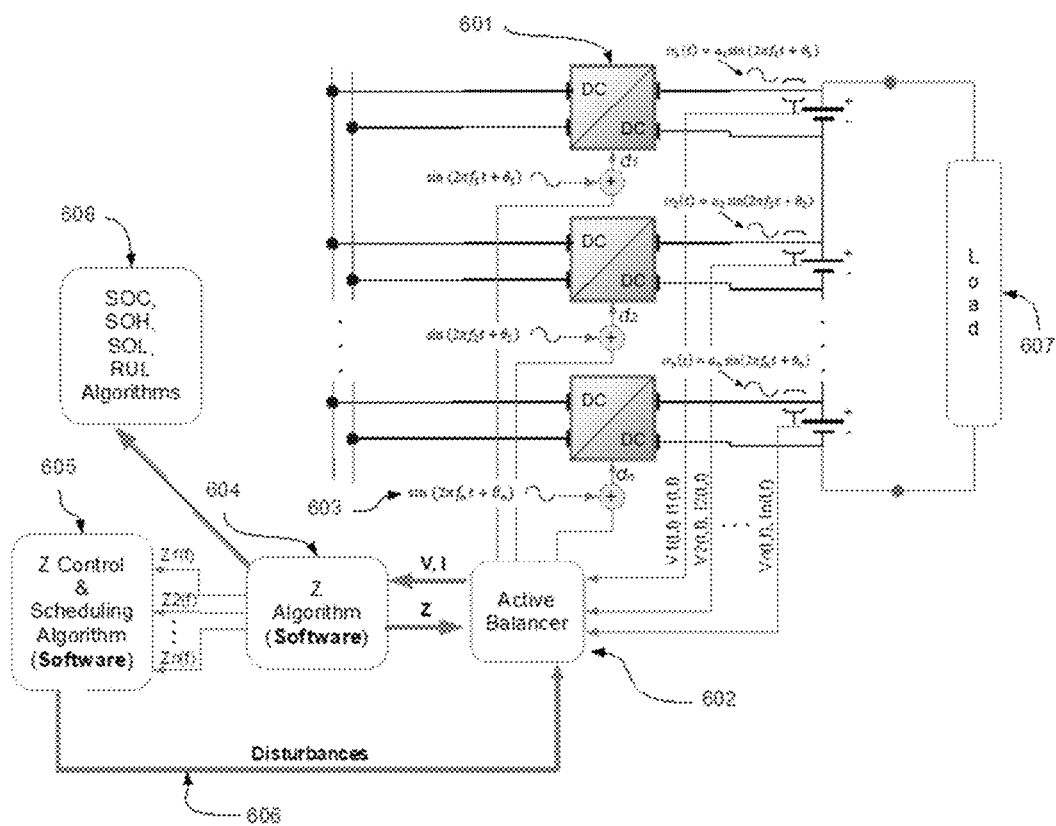
FIG. 6 is a more detailed illustration of an embodiment for an active balancer with an exemplary function of impedance measurement where each active balancer circuit associated with a cell is as a DC/DC converter.

FIG. 6 is a more detailed illustration of an embodiment for an active balancer with an exemplary function of impedance measurement where each active balancer circuit associated with a cell is as a DC/DC converter. The active balancer has been implemented in this case using DC/DC converters, such as 601, which are associated with every cell in series. The DC/DC converters extract more or less energy out of each associated cell to accomplish balancing but with the added feature that the switching of the DC/DC converters has an additional disturbance, such as 603. The disturbance causes the associated cell to have a current and voltage ripple at a desired frequency, which in turn can be used to measure cell impedance at that frequency. Again, more complex strategies are possible using embodiments with multiple tones and waveforms, such as spread spectrum waveforms. The impedance measurement results can then be used by other algorithms and sub-systems within the BMS to accomplish their task more accurately, for instance, in 608 for estimating SOC, SOH, and predicting SOL and RUL with knowledge of updated impedance measurements. The Z algorithm 604 can compute impedances for all cells from measurements obtained from the active balancer as shown in FIG. 6. The impedance computed may be sent back to the active balancer for it to accomplish its active balancing task more accurately. The measured impedance may also be sent to the impedance controller 605 that decides when, what cells, and how to measure the impedance.

What is claimed is:

1. A method of energy control in an energy storage system, comprising:
providing an active balancer comprising a plurality of active balancer circuits connected to a plurality of battery cells creating an active balancer system;
performing active balancing of the battery cells using the plurality of active balancer circuits;
introducing, by an active balancer controller, current disturbance signals or voltage disturbance signals at predetermined frequencies from one or more of the active balancer circuits into one or more of the battery cells;
measuring, by a processor, impedance of the one or more battery cells receiving the disturbance signals as a ratio of the voltage disturbance signals to the current disturbance signals; and
using out of phase disturbances in multiple active balancer circuits as impedance measurement devices in the active balancer to cancel or minimize load ripple.

2. The method of claim 1, further comprising measuring impedance of the plurality of battery cells using disturbance signals transmitted over the connection from the plurality of active balancer circuits to the plurality of battery cells.

3. The method of claim 2, further comprising:
injecting multi-tone, orthogonal, or spread spectrum waveforms simultaneously, by the plurality of active balancer circuits, to speed up the measurement of battery pack impedance.

4. The method of claim 2, wherein the impedance measurement is performed while one of the battery cells is in one of states of charged, discharged or at rest using the active balancing circuit.

5. The method of claim 2, wherein the impedance measurement is performed while one of the battery cells is in of states of charged, discharged or at rest using a passive balancing circuit where the resistors used for passive balancing are connected and disconnected over time to obtain a pulse discharge voltage and current waveform used for impedance computation.

6. The method of claim 1, further comprising:
using spread spectrum disturbance waveforms in all or a sub-set of the active balancer circuits in the active balancer.

7. The method of claim 6, further comprising:
minimizing load ripple caused by disturbances used to measure impedance by using spread spectrum disturbance waveforms in all or a sub-set of the active balancer circuits in the active balancer.

8. A system of energy control in an energy storage system, comprising:
an active balancer controller, connected to a bank of battery cells, comprising a processor that is programmed to execute instructions to:
introduce, by an active balancer controller performing active balancing of a plurality of active balancer circuits, current disturbance signals or voltage disturbance signals at predetermined frequencies into one or more of the battery cells;
measuring, by the processor, impedance of the one or more battery cells receiving the disturbance signals as a ratio of the voltage disturbance signals to the current disturbance signals; and using out of phase disturbances in multiple active balancer circuits as impedance measurement devices in the active balancer to cancel or minimize load ripple.

9. The method of claim 8, further comprising measuring impedance of the plurality of battery cells using disturbance signals transmitted over the connection from the plurality of active balancer circuits to the plurality of battery cells.

10. The method of claim 9, further comprising:
injecting multi-tone, orthogonal, or spread spectrum waveforms simultaneously, by the plurality of active balancer circuits, to speed up the measurement of battery pack impedance.

11. The method of claim 8, further comprising:
using spread spectrum disturbance waveforms in all or a sub-set of the active balancer circuits in the active balancer.

12. The method of claim 11, further comprising:
minimizing load ripple caused by disturbances used to measure impedance by using spread spectrum disturbance waveforms in all or a sub-set of the active balancer circuits in the active balancer.

* * * * *